United States Patent
Dubois et al.

(10) Patent No.: US 9,484,483 B2
(45) Date of Patent: Nov. 1, 2016

(54) DEVICE AND METHOD FOR RESTORING SILICON-BASED SOLAR CELLS USING AN ULTRASOUND TRANSDUCER

(71) Applicant: COMMISSARIAT À L'ENERGIE ATOMIQUE ET AUX ENERGIES ALTERNATIVES, Paris (FR)

(72) Inventors: Sébastien Dubois, Scionzier (FR); Nicolas Enjalbert, Burlats (FR); Jean-Paul Garandet, Le Bourget du Lac (FR); Pierre Gidon, Echirolles (FR); Florent Tanay, Grenoble (FR); Jordi Veirman, Poisy (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/428,559

(22) PCT Filed: Sep. 16, 2013

(86) PCT No.: PCT/FR2013/000241
§ 371 (c)(1),
(2) Date: Mar. 16, 2015

(87) PCT Pub. No.: WO2014/041261
PCT Pub. Date: Mar. 20, 2014

(65) Prior Publication Data
US 2015/0263216 A1    Sep. 17, 2015

(30) Foreign Application Priority Data

Sep. 14, 2012   (FR) ..................... 12 02455

(51) Int. Cl.
*H01L 31/18*    (2006.01)
*H01L 31/04*    (2014.01)
(Continued)

(52) U.S. Cl.
CPC ......... *H01L 31/1864* (2013.01); *H01L 31/028* (2013.01); *H01L 31/04* (2013.01);
(Continued)

(58) Field of Classification Search
None
See application file for complete search history.

(56) References Cited

U.S. PATENT DOCUMENTS 8,136,478 B2    3/2012  Buchner et al.
2010/0200060 A1    8/2010  Liu

FOREIGN PATENT DOCUMENTS

CN    201450015 U    5/2010
EP    1054457 A2    11/2000
(Continued)

OTHER PUBLICATIONS

Lee; "Rapid thermal processing of silicon solar cells-passivation and diffusion;" Dissertation; Jan. 1, 2003; pp. 1-30.
(Continued)

*Primary Examiner* — Cheung Lee
(74) *Attorney, Agent, or Firm* — Oliff PLC

(57) ABSTRACT

The restoration device of least one silicon-based photovoltaic solar cell includes a support of the cell, a heat source configured to heat the photovoltaic solar cell, and unit for generating charge carriers in the cell. To better accelerate the restoration kinetics of the solar cell, the device includes an ultrasonic transducer designed to generate ultrasonic waves propagating in the photovoltaic solar cell.

27 Claims, 5 Drawing Sheets

(51) Int. Cl.
 *H01L 31/028* (2006.01)
 *H02S 99/00* (2014.01)
(52) U.S. Cl.
 CPC .......... *H01L 31/182* (2013.01); *H01L 31/186* (2013.01); *H02S 99/00* (2013.01); *Y02E 10/546* (2013.01); *Y02P 70/521* (2015.11); *Y10T 29/41* (2015.01)

(56) References Cited

FOREIGN PATENT DOCUMENTS

JP       2011243687 A    12/2011
WO       2007107351 A1    9/2007

OTHER PUBLICATIONS

Glunz et al; "Stable czochralski silicon solar cells using gallium-doped base material;" 16th E.C. Photovoltaic Solar Energy Conference. Glascow, United Kingdom; May 1-5, 2000; vol. Conf. 16; pp. 1070-1075.

Rein et al; "Analysis of the high-temperature improvement of cz-silicon;" 16th E.C. Photovoltaic Solar Energy Conference; Glascow, United Kingdom; May 1-5, 2000; vol. Conf. 16; pp. 1201-1205.

Nov. 4, 2013 International Search Report issued in International Patent Application No. PCT/FR2013/000241.

US 9,484,483 B2

DEVICE AND METHOD FOR RESTORING SILICON-BASED SOLAR CELLS USING AN ULTRASOUND TRANSDUCER

BACKGROUND OF THE INVENTION

The invention relates to a device and a method designed to eliminate the degradation effects of the efficiency under illumination of silicon-based photovoltaic solar cells.

STATE OF THE ART

Photovoltaic solar cells manufactured from substrates made from amorphous silicon (a-Si), monocrystalline silicon (sc-Si) or multicrystalline silicon (mc-Si) can undergo a degradation effect of the efficiency under illumination. This phenomenon occurs during the first uses of the photovoltaic solar cells, and it is usually called LID effect (LID standing for Light Induced Degradation). The physical mechanisms at the origin of this degradation of the efficiency of photovoltaic solar cells under illumination do however remain incompletely known. Furthermore, several scientific studies have shown that light elements present in the silicon, in particular hydrogen (H), boron (B) and oxygen (O) atoms, generally participate in formation and in activation of defects when the photovoltaic solar cells are illuminated.

The LID effects can be eliminated by injecting charge carriers into the photovoltaic solar cells while at the same time heating said cells. International Patent application WO 2007/107351 discloses a method aiming to achieve stabilisation of the efficiency of photovoltaic solar cells when the latter are illuminated. In this document, the restoration method of the cells comprises a charge carrier injection step via an illumination or a forward polarisation of the photovoltaic solar cell and a heating step of the substrate to a temperature comprised between 50° C. and 230° C. This restoration method enabled the treated photovoltaic solar cell to recover stable performances under normal operating conditions. The restoration effects only take place if the temperature of the photovoltaic solar cells does not exceed a certain limit temperature which is typically about 200° C. or an even lower temperature. The performances of certain silicon-based photovoltaic solar cells can in fact be affected when they are maintained at temperatures of more than 150° C.

Furthermore, the method described in the document referenced above requires very long treatment times for complete restoration of the photovoltaic solar cells. What is meant by treatment times is the time during which the solar cells are kept at a certain temperature when generation of charge carriers in the cells is performed. The treatment times, according to the method described in this document, can be as long as a several tens or even a hundred hours, which makes this method incompatible with conventional industrial manufacturing methods of photovoltaic solar cells.

Treatments have in fact been performed, by means of the method described in this document, to restore solar cells produced from substrates made from silicon purified by metallurgical means. For this type of solar cells, the restoration mechanisms required between 10 and 40 hours for high temperatures comprised between 150 and 180° C.

Furthermore, the restoration kinetics of the photovoltaic solar cells can be accelerated by increasing the quantity of charge carriers injected into the treated photovoltaic solar cell. This increase can be achieved in particular by increasing the power of the incident illumination or the intensity of the electric current input to the cell. It was observed that such an increase resulted in an increase of the temperature of the photovoltaic solar cell, limiting or even completely counteracting the restoration effects of the photovoltaic solar cell.

Utility model application CN201450015 describes a device for heating and illuminating silicon-based solar cells to restore them. The device comprises a system of fans to cool the photovoltaic solar cells when the treatment is performed. However, the use of a fan-based system does not enable solar cells of good quality to be obtained. In particular, it was observed that this type of device can generate problems of mechanical stresses, thereby creating microcracks in the photovoltaic solar cells.

OBJECT OF THE INVENTION

A requirement exists to provide an effective device to efficiently restore silicon-based photovoltaic solar cells to counteract degradation of the efficiency under illumination, while at the same time preserving the mechanical integrity and the photovoltaic performances of the treated cells.

This requirement tends to be satisfied by providing a restoration device of at least one silicon-based photovoltaic solar cell, comprising a heat source configured to heat the photovoltaic solar cell, and means for generating charge carriers in the photovoltaic solar cell. The device further comprises an ultrasonic transducer designed to generate ultrasonic waves propagating in the photovoltaic solar cell.

Advantageously, the device comprises elements configured to regulate the temperature of the photovoltaic solar cell to a target temperature value or range comprised in the 50° C.-230° C. range. The elements performing regulation of the temperature of the photovoltaic solar cell further advantageously comprise a tank designed to be filled by a liquid and a support of the photovoltaic solar cell configured to place the latter in the liquid.

The tank in advantageous manner further comprises a temperature regulator of the liquid configured to regulate the temperature of the photovoltaic solar cell to the target temperature value or range.

A method is also provided for performing restoration of at least one silicon-based photovoltaic solar cell to counteract degradation of the efficiency under illumination comprising the following steps:
  heating the photovoltaic solar cell;
  generating charge carriers in the photovoltaic solar cell; and
  generating ultrasonic waves in stationary regime in the photovoltaic solar cell.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The restoration device of silicon-based photovoltaic solar cells described in the following differs from the prior art in particular in that it provides elements enabling generation of ultrasonic waves in stationary regime in the cells to be treated to enhance the restoration kinetics of the treated cells.

Figure 1:
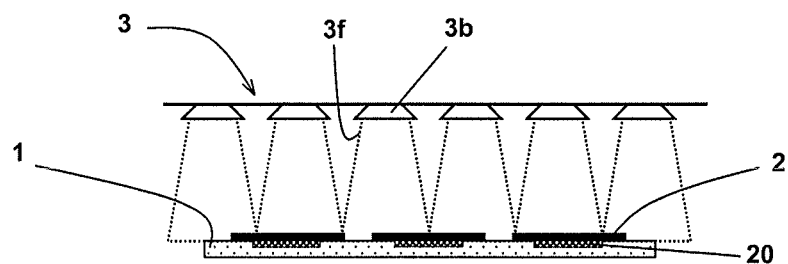
FIGS. 1, 3 to 6, 8 and 9 schematically illustrate devices according to different embodiments, in cross-section.

According to a particular embodiment illustrated in FIG. 1, a restoration device of silicon-based photovoltaic solar cells comprises a support 1 of at least one photovoltaic solar cell 2. The restoration device also comprises means 3 for generating charge carriers in photovoltaic solar cell 2, and a heat source (not shown) configured to heat photovoltaic solar cell 2. Preferentially, the heat source is configured to heat photovoltaic solar cell 2 to a temperature comprised between 50° C. and 230° C. Advantageously, the device comprises elements configured to control and regulate the temperature of photovoltaic solar cell 2 to a target temperature value or range comprised in the 50° C.-230° C. range.

Charge carrier generating means 3 can for example comprise a light source illuminating photovoltaic solar cell 2 or means for injecting an electric current into photovoltaic solar cell 2. In other words, means 3 for generating charge carriers in photovoltaic solar cell 2 comprise means for injecting an electric current into said cell 2. The injection means can for example comprise point probes connected to a potential difference source. Said point probes are configured to come into contact with photovoltaic solar cell 2 to inject an electric current into the latter.

In FIG. 1, charge carrier generating means 3 are represented as being a light source 3b illuminating photovoltaic solar cell 2 by a light beam 3f. Charge carrier generating means 3 can also constitute the heat source of the restoration device. For example, halogen lamps can constitute both the charge carrier generating means and the heat source.

The restoration device enables photovoltaic solar cell 2 to be heated while at the same time injecting charge carriers into it, to restore said cell from the effects of degradation of the efficiency under illumination. In order to increase the efficiency of restoration and to accelerate its kinetics, the device comprises at least one ultrasonic transducer 20 configured to generate ultrasonic waves in stationary regime propagating in photovoltaic solar cell 2. Preferentially, the ultrasonic transducer generates ultrasonic waves having a frequency comprised between 10 and 3000 kHz and a power of a few $W \cdot cm^{-2}$, typically a power comprised between 0.1 and 80 $W \cdot cm^{-2}$.

Propagation of the ultrasonic waves in the photovoltaic solar cell in advantageous manner enhances the effects of diffusion, reorientation and dissociation of the defects and impurity complexes. Furthermore, the restoration device combines the effects of generation of charge carriers in the photovoltaic solar cell, of advantageously controlled and regulated heating of said cell, and of generation of ultrasonic waves in the cell. This combination of these effects thus advantageously enhances the restoration kinetics of the photovoltaic solar cell resulting in a reduction of the treatment time of the photovoltaic solar cells.

Advantageously, ultrasonic transducer 20 is fitted between support 1 and photovoltaic solar cell 2. This arrangement enables a better propagation of the ultrasonic waves generated by transducer 20 to be obtained in photovoltaic solar cell 2. In similar manner, the heat source is advantageously arranged in support 1, which enables efficient diffusion and control of the temperature of the photovoltaic solar cell. For example, the heat source can comprise electric resistance heaters or thermoelectric devices placed in support 1.

Figure 2:
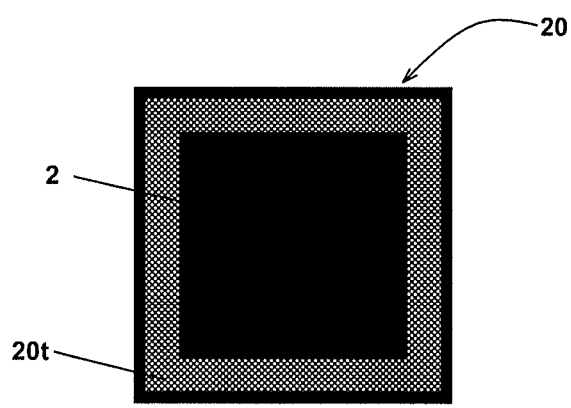
FIG. 2 schematically illustrates a top view of a device according to a particular embodiment.

According to a particular embodiment illustrated in FIG. 2, ultrasonic transducer 20 is shaped in such a way as to receive photovoltaic solar cell 2. In other words, transducer 20 is configured in such a way as to be in direct contact with photovoltaic solar cell 2, so that the latter can be arranged directly on ultrasonic transducer 20. In this case, ultrasonic transducer 20 acts as a support of photovoltaic solar cell 2 and thereby replaces support 1.

Preferentially, transmission surface 20t of the ultrasonic waves of said transducer 20 is square and comprises the whole contact surface between photovoltaic solar cell 2 and ultrasonic transducer 20. What is meant by transmission surface is a geometric surface each point of which enables an ultrasonic wave to be transmitted having a wave vector perpendicular to said surface at this point. Advantageously, ultrasonic transducer 20 is configured in such a way that the energy received by photovoltaic solar cell 2 is about a few $W \cdot cm^{-2}$, typically a received energy comprised between 0.1 and 10 $W \cdot cm^{-2}$. Ultrasonic transducer 20 is thus advantageously chosen such as to have a power comprised between 0.1 and 10 $W \cdot cm^{-2}$.

Figure 3:
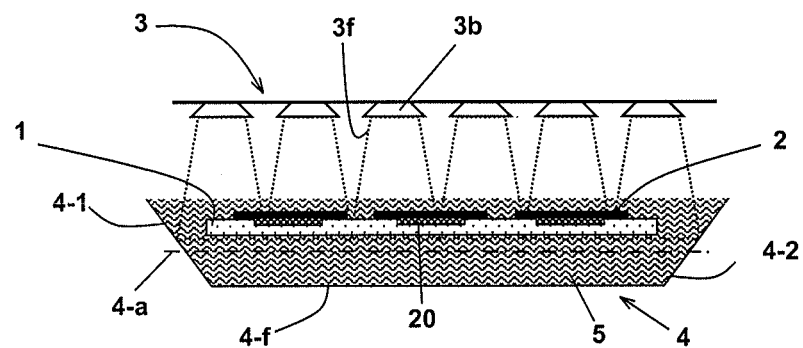

According to a particular embodiment illustrated in FIG. 3, the elements configured to regulate the temperature of photovoltaic solar cell 2 comprise a tank 4 designed to be filled by a liquid 5 enabling the temperature of photovoltaic solar cell 2 to be regulated to a target temperature value or range comprised in the 50° C.-230° C. range. Furthermore, support 1 is configured to place photovoltaic solar cell 2 in liquid 5. The cell is in particular totally immersed in liquid 5. Tank 4 comprises a bottom 4-f and side walls. In a particular embodiment, the side walls comprise a first side wall 4-1 located at the level of a first end of tank 4, and a second side wall 4-2 located at the level of a second end opposite the first end in the direction of a longitudinal axis 4-a of arrangement of said cells 2.

Arranging photovoltaic solar cell 2 in liquid 5 enables an efficient and homogenous dissipation of a temperature rise of said cell 2, in particular when charge carrier injection is performed. A strong charge carrier injection enables the restoration kinetics to be accelerated thereby reducing the treatment time of the photovoltaic solar cells. On account of photovoltaic solar cell 2 being immersed in liquid 5, the temperature rise generated by the injected quantity of charge carriers is efficiently dissipated, which enables regulation of the temperature of photovoltaic solar cell 2 to be obtained, while avoiding problems of thermomechanical stresses. The restoration device equipped with ultrasonic transducer 20 and tank 4 thus advantageously enables both the stress on an increase of generation of charge carriers to be relaxed and the ultrasonic waves to be used to achieve a rapid and efficient restoration of the silicon-based photovoltaic solar cells, while at the same time preserving the mechanical integrity of said cells. In addition, generation of the stationary ultrasonic waves enhances stirring of liquid 5.

Figure 4:
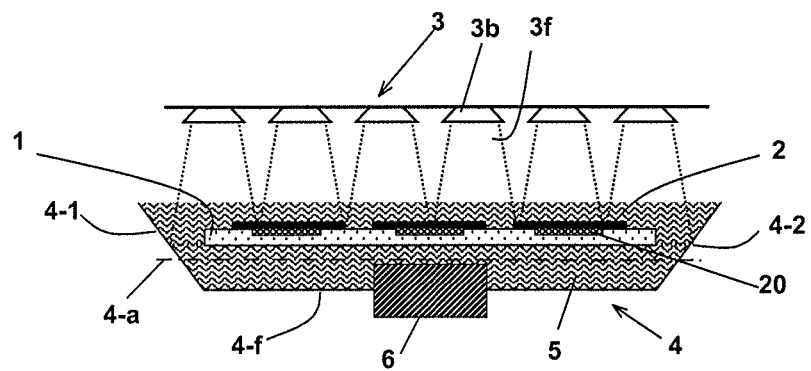

According to a particular embodiment illustrated in FIG. 4, tank 4 of the restoration device comprises a regulator 6 of the temperature of liquid 5. For example, regulator 6 can comprise thermoelectric devices located in the walls of tank 4 and controlled by a control circuit not represented in FIG. 3.

Regulator 6 enables the temperature of liquid 5 in tank 4, and therefore the temperature of photovoltaic solar cell 2, to be controlled with precision. Regulator 6 thus enables the temperature of photovoltaic solar cell 2 to be regulated to a target temperature value or temperature range when charge carrier injection is performed. Advantageously, temperature regulator 6 of liquid 5 is configured to regulate the temperature of photovoltaic solar cell 2 to a target temperature value (for example to 170° C.) or temperature range (for example between 120° C. and 190° C.), comprised in the 50° C.-230° C. range. In other words, whether the regulation concerns a given temperature value or a temperature range, the temperature value or range advantageously remains comprised within the 50° C.-230° C. range. For silicon-based photovoltaic cells, the restoration effect is maximal when the temperature of the cell is comprised within this temperature range. The 50° C.-230° C. temperature range thus enables rapid and efficient restoration of photovoltaic solar cell 2 from the effects of degradation of the efficiency under illumination to be achieved, while at the same time preserving the photovoltaic performances of said cells.

Figure 5:
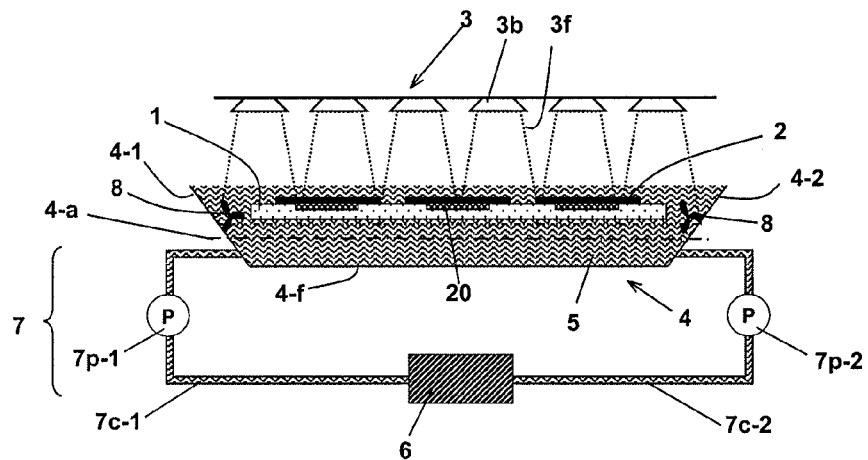

In a particular embodiment illustrated in FIG. 5, tank 4 comprises circulation means 7 for making liquid 5 circulate in tank 4. Circulation means 7 of liquid 5 preferably comprise a first pipe 7c-1 and a second pipe 7c-2 connected to one another at one of their ends. First pipe 7c-1 can be connected to tank 4 via an opening formed in first side wall 4-1. The second pipe is connected to tank 4 via an opening preferentially formed in second side wall 4-2. In order to make liquid 5 circulate in tank 4, first pipe 7c-1 can for example comprise a first pump 7p-1 configured to suck liquid 5 from tank 4 to second pipe 7c-2 which comprises a second pump 7p-2. Second pump 7p-2 is configured to inject liquid 5 into tank 4. This configuration of first 7c-1 and second 7c-2 pipes enables flow of liquid 5 in tank 4 along longitudinal axis 4-a.

Flow of liquid 5 in tank 4 advantageously enables a better homogenisation of the temperature of liquid 5 in tank 4, which enables a better dissipation of the heat from photovoltaic solar cell 2 to liquid 5. In advantageous manner, circulation means 7 are connected to temperature regulator 6 of liquid 5. According to this embodiment, temperature regulator 6 is configured so as to control the temperature of liquid 5 injected into tank 4 via second pipe 7c-2. Preferentially, the control circuit of temperature regulator 6 also controls first 7p-1 and second 7p-2 pumps. Advantageously, the control circuit is configured to define the temperature of photovoltaic solar cell 2 or a temperature range authorised for cell 2.

Figure 6:
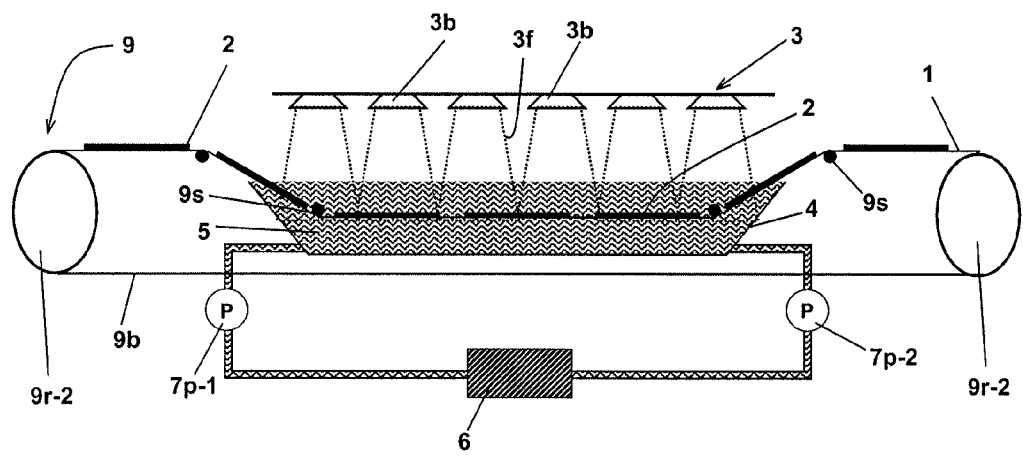
Figure 7A:
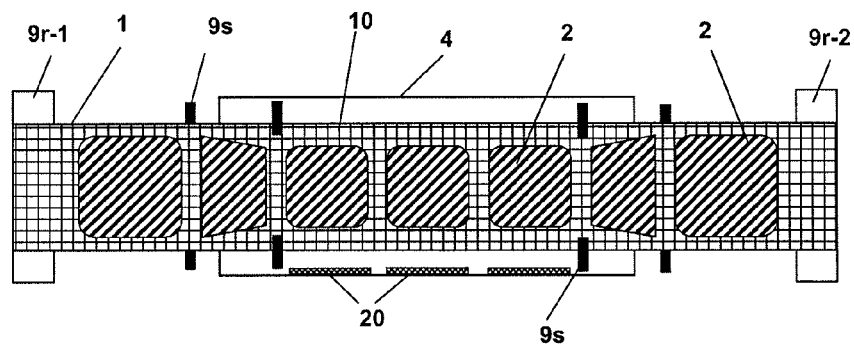
FIGS. 7A and 7B schematically and respectively illustrate a top view and a side view of the device of FIG. 6.
Figure 7B:
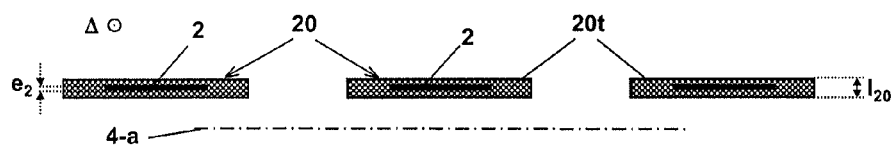

According to an embodiment illustrated in FIGS. 6, 7A and 7B, the restoration device comprises a movement device 9 for moving support 1 in tank 4. Movement device 9 is configured to make photovoltaic solar cell 2 move in a direction parallel to the surface of liquid 5 in tank 4. Support 1 is shaped in such a way as to ensure stable securing of photovoltaic solar cells 2 on its surface. Movement device 9 of support 1 can be of the conveyor belt type. Preferably, movement device 9 can comprise first 9r-1 and second 9r-2 main rollers around which support 1 is wound to form a closed loop 9b. Movement device 9 further comprises secondary rollers 9s configured to modify the axis of translation of support 1 when movement of the latter takes place along the path of closed loop 9b. As illustrated in FIG. 7A, secondary rollers 9s are in contact only with the edges of support 1. This arrangement prevents there being any contact between secondary rollers 9s and photovoltaic solar cells 2 when movement of support 1 takes place. Furthermore, at least one of the two main rollers 9r-1 and 9r-2 is a drive roller configured to make support 1 move following the path of closed loop 9b.

This configuration of the restoration device thereby enables accelerated restoration of several photovoltaic cells arranged for example following one another or side by side on rolling support 1. The restoration device can thus easily integrate a large-scale production line.

Preferably, first main roller 9r-1 is an idler roller and second main roller 9r-2 is a drive roller configured to obtain a direction of movement of support 1 opposite to the direction of movement of liquid 5 in tank 4. These opposite movements of support 1 and of liquid 5 then enable a better heat dissipation from photovoltaic solar cells 2 to liquid 5 and enhance stirring of liquid 5.

Advantageously, ultrasonic transducer 20 is arranged in tank 4 so as to establish a stationary regime of ultrasonic waves in liquid 5. Preferentially, ultrasonic transducer 20 is located in the tank so as to be as close as possible to the photovoltaic solar cell 2 to be treated. In order not to disturb propagation of the ultrasonic waves to photovoltaic solar cell 2, ultrasonic transducer 20 is preferably arranged in such a way as to avoid there being any solid obstacle, such as support 1, between ultrasonic transducer 20 and said cell 2. As illustrated in FIG. 7A, ultrasonic transducer 20 is in advantageous manner located in a wall of tank 4 so as to be facing the edge of support 1 and of photovoltaic solar cell 2. Thus, when movement of support 1 in the tank takes place, the photovoltaic solar cell passes in front of ultrasonic transducer 20. This advantageous arrangement enables all the areas of photovoltaic solar cell 2 to be swept by the ultrasonic waves in homogenous manner. In advantageous manner and as illustrated in FIG. 7B, ultrasonic transducer 20 has a rectangular shape, and it comprises a transmission surface 20t of the ultrasonic waves having a width $I_{20}$ that is greater than the thickness $e_2$ of photovoltaic solar cell 2. The direction Δ of the ultrasonic wave vectors is then substantially perpendicular to the edge of photovoltaic solar cell 2, in other words perpendicular to the longitudinal axis 4-a.

Furthermore, ultrasonic transducer 20 advantageously enables generation of a convection movement in liquid 5, thereby resulting in stirring of the liquid and homogenisation of its temperature. This particular embodiment thus advantageously enables both a better regulation of the temperature of the photovoltaic solar cell to be treated and generation ultrasonic waves in a stationary regime in said cell.

Tank 4 can also comprise a mechanical stirring circuit of liquid 5 in tank 4. Preferentially, this stirring circuit is associated with circulation means 7 of liquid 5 in tank 4. The stirring circuit can comprise at least one propeller 8 arranged in tank 4, for example on one of the side walls.

According to an embodiment illustrated in FIG. 7A, support 1 comprises pass-through holes 10 so that liquid 5 is in contact with the surface of photovoltaic solar cell 2 arranged on support 1. This configuration of support 1 enables the contact surface between photovoltaic solar cells 2 and liquid 5 to be increased when the cells are immersed in tank 4. The increase of the contact surface between liquid 5 and the photovoltaic solar cells then advantageously enables better heat exchanges to be ensured between photovoltaic solar cells 2 and liquid 5. Furthermore, it is also advantageous for support 1 to be formed by a material having a higher thermal conductivity $\lambda_s$ than the thermal conductivity of photovoltaic solar cell $\lambda_c$. Support 1 is preferentially formed by flexible stainless steel meshes.

Figure 8:
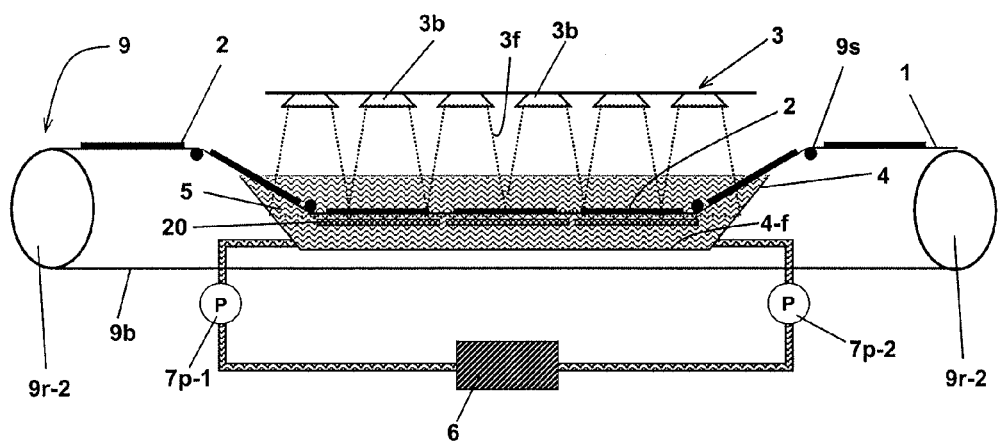

According to a particular embodiment illustrated in FIG. 8, the restoration device comprises a movement device 9 for moving support 1 in tank 4, and advantageously ultrasonic transducer 20 is located underneath support 1. In other words, ultrasonic transducer 20 is located between the bottom of tank 4-f and support 1.

Advantageously, the restoration device comprises a general control circuit (not illustrated in the figures) configured to control:
- means 3 for generating charge carriers injected into photovoltaic solar cell 2;
- ultrasonic transducer 20; and
- advantageously, temperature regulator 6 of liquid 5 in tank 4.

The general control circuit can thus be configured to regulate the temperature of photovoltaic solar cell 2 to a target temperature or temperature range comprised between 50° C. and 230° C., and advantageously between 120° C. and 210° C. The general control circuit preferentially also controls the speed of movement of support 1 in tank 4, and the stirring means.

As illustrated in the different figures, charge carrier generating means 3 comprise a light source 3b designed to illuminate photovoltaic solar cell 2. Light source 3b can comprise monochromatic lamps producing an incident light beam having a wavelength comprised between 300 and 1300 nm. Light source 3b can also comprise halogen or xenon lamps enabling a white light to be produced. Light source 3b is preferentially configured to provide an intense illumination so that the photovoltaic cells receive an illumination of more than 0.05 W·cm$^{-2}$. Light source 3b can further comprise a laser source which advantageously generates an intense illumination. The use of a laser source advantageously enables a reduction of the power consumption to be achieved in comparison with other light sources.

Figure 9:
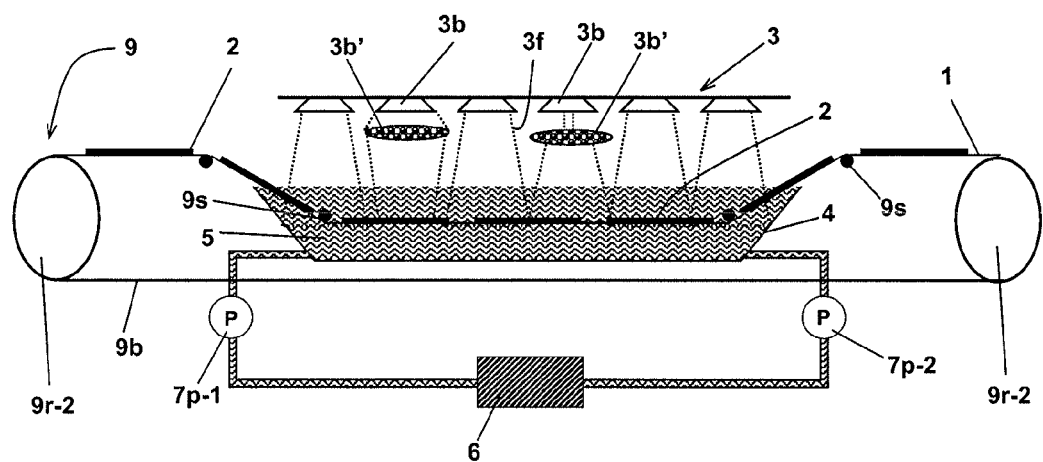

According to a particular embodiment illustrated in FIG. 9, light source 3b comprises an optic system 3b' arranged between photovoltaic solar cells 2 and light source 3b. For example, when light source 3b is a laser source, it is advantageous to use a diverging lens as optic system 3b'. A diverging lens thus enables the surface of the photovoltaic solar cell receiving the illumination to be increased. When the light source is formed by a halogen lamp or a monochromatic lamp on the other hand, it is advantageous to use a converging lens as optic system to concentrate the light beam and increase the illumination received by photovoltaic solar cell 2.

Conventional restoration methods of photovoltaic solar cells are performed by heating the cells in a conventional furnace (or heating plate) while generating a quantity of charge carriers in the cells.

According to a particular embodiment of a restoration method of silicon-based photovoltaic solar cells from the effects of degradation of the efficiency under illumination, a stationary regime of ultrasonic waves is generated to accelerate the restoration kinetics.

Preferentially, the method uses one of the restoration devices described in the foregoing and illustrated in FIGS. 1 to 8. The restoration method comprises a step wherein a photovoltaic solar cell 2 made of an amorphous, monocrystalline or multicrystalline silicon-based substrate or active layer is provided.

The restoration method comprises a heating step of photovoltaic solar cell 2 and a step of generating charge carriers in said cell 2. The method also comprises a step of generating a stationary regime of ultrasonic waves in photovoltaic solar cell 2. Furthermore, such a method can advantageously be implemented with regulation of the temperature of the photovoltaic solar cell to a target temperature value or range comprised in the 50° C.-230° C. range and advantageously in the 120° C.-210° C. range.

Temperature regulation can further be performed by a step where photovoltaic solar cell 2 is immersed in a liquid 5 when generation of charge carriers is performed in said cell 2. Preferentially, to execute the method, the restoration device comprising temperature regulator 6 of liquid 5 is used.

In fact, depending on the type of generating means 3, by illumination or by electric current input, liquid 5 can be either transparent to the emitted light beam or electrically insulating. Preferentially, the charge carriers are injected into photovoltaic solar cell 2 by generating means 3 comprising a light source 3b, and liquid 5 is transparent to light beam 3f emitted by said source 3b.

Liquid 5 can be chosen according to its physico-chemical properties, in particular the acoustic impedance, specific heat capacity, latent vaporisation heat, thermal conductivity, and viscosity.

Preferentially, liquid 5 is non-toxic and does not affect the performances of the silicon-based photovoltaic solar cells. Furthermore, the wettability criterion of liquid 5 on photovoltaic solar cell 2 is also a criterion liable to be taken into account. This criterion can in fact play a role in ensuring an efficient heat transfer between liquid 5 and photovoltaic solar cell 2. Advantageously, liquid 5 has a contact angle with said cell 2 that is less than 90° and preferably about 45°.

To perform the restoration method, liquid 5 used for regulating the temperature of the photovoltaic solar cell is advantageously chosen so as not to evaporate during the restoration treatment. The choice of the liquid used is thus intimately linked to the criteria set out above, but also to the temperature range in which the restoration method is performed. As described in the foregoing, the restoration method is advantageously performed at a temperature comprised between 50° C. and 230° C. In advantageous manner, liquid 5 is thus chosen so as to have a boiling temperature strictly higher than 100° C. and advantageously higher than or equal to about 230° C.

For example, liquid 5 can be chosen from the family of heat transfer liquids. This type of liquid distinguishes itself by its ability to regulate the temperature of its environment. Advantageously, liquid 5 comprises ethylene glycol or glycerol. Ethylene glycol is a non-toxic heat transfer fluid which has a boiling temperature of 198° C. Glycerol is a non-toxic liquid which has a boiling temperature of 290° C., but it does however begin to decompose at a temperature of more than 171° C.

Furthermore, liquid 5 can comprise a soluble cutting oil which notably comprises a mineral oil, an emulsifier and water. Cutting oils have interesting physical characteristics. Cutting oils are in fact generally transparent and have a viscosity close to that of water. In addition, this type of liquid has an interesting cooling power, and it remains in liquid state for temperatures of more than 100° C.

Furthermore, liquid 5 is advantageously chosen such as to have an acoustic impedance as close as possible to that of silicon-based photovoltaic solar cell 2. This condition, concerning the acoustic impedance of liquid 5, enables a perfect energy coupling between liquid 5 and said cell 2, thereby generating an optimal propagation of the ultrasonic waves from ultrasonic transducer 20 to photovoltaic solar cell 2. The transmission coefficient T of an ultrasonic wave at the interface between two environments A and B does in fact depend on the respective acoustic impedances of these two environments. The transmission coefficient T is given by the following relation:

$$T = \frac{I_t}{I_i} = \frac{4 \times Z_A Z_B}{(Z_A + Z_B)^2} \quad (1)$$

where:
- $I_t$ and $I_i$ respectively represent the transmitted and incident acoustic intensities (or powers); and
- $Z_A$ and $Z_B$ respectively represent the acoustic impedances of the environments A and B.

Photovoltaic solar cell 2 is mainly made from a silicon-based. The acoustic impedance of said cell 2 can thereby be substantially equal to that of silicon. Furthermore, considering that the transfer coefficient at the interface between ultrasonic transducer 20 and liquid 5 is substantially of the same magnitude as that at the interface between liquid 5 and said cell 2, the power of the transducer can thus be adjusted so as to specify the energy of ultrasonic origin received by cell 2.

In order for propagation of the ultrasonic waves in the photovoltaic solar cell to be able to act on the defects and impurity complexes, the "ultrasonic" energy received by said cell 2 is preferably comprised between 0.1 and 10 W·cm$^{-2}$. The power of ultrasonic transducer 20 and the transmission coefficient of the ultrasonic waves at the interface between liquid 5 and said cell 2 are thereby advantageously adjusted so that the photovoltaic solar cell to be restored receives an energy comprised between 0.1 and 10 W·cm$^{-2}$. By adjusting the power of the ultrasonic transducer and/or by choosing a liquid 5 having an optimal acoustic impedance (i.e. enabling a maximal transmission coefficient T at the interface between liquid 5 and said cell 2), the energy received by the cell can in fact advantageously be fixed at a value comprised between 0.1 and 10 W·cm$^{-2}$.

The acoustic impedance of silicon depends on its crystallographic orientation and can be comprised between $11*10^6$ and $22*10^6$ N·s·m$^{-3}$. For example, by choosing glycol ($Z_{glycol}=2.34*10^6$ N·s·m$^{-3}$) as temperature regulation liquid 5, the transmission coefficient at the interface between the glycol and photovoltaic solar cell 2 can be estimated at a value comprised between 0.35 and 0.58. Thus, for photovoltaic solar cell 2 to receive an energy comprised between 0.1 and 10 W·cm$^{-2}$, the power of ultrasonic transducer 20 is advantageously adjusted to a value comprised between 0.3 and 80 W·cm$^{-2}$.

The restoration method advantageously enables ultrasonic waves to be used and the stress on the charge carrier generation step to be relaxed. The method thus enables the effects of diffusion, reorientation and dissociation of the defects to be enhanced and the intensity of the charge carrier generation in the cell to be increased, while at the same time regulating its temperature to a suitable temperature to obtain rapid and efficient restoration.

For example, a photovoltaic solar cell restoration device comprising an ultrasonic transducer was produced. The charge carrier generating means are formed by halogen lamps enabling the photovoltaic solar cell to receive an illumination of an intensity of 3 W·cm$^{-2}$. Using conventional restoration devices, the temperature of the photovoltaic solar cell cannot be maintained under 145° C. when said cell receives an illumination intensity of more than a few tens of W·cm$^{-2}$.

For the restoration method, temperature-regulated ethylene glycol was used to regulate the temperature of the treated cell to a temperature substantially equal to 145° C. The method according to the invention enabled the cell to be restored using an intense illumination of 3 W·cm$^{-2}$, after only 4 minutes of treatment. For comparison purposes, restoration methods according to the prior art showed that the healing mechanisms took place between 10 and 40 hours of treatment. These tests were carried out by heating the cells to a temperature comprised between 150° C. and 180° C., with an illumination of 0.1 W·cm$^{-2}$.

The restoration device and method described above can be applied to one or more photovoltaic solar cells, which can be placed in a module or not.

The invention claimed is:

1. A restoration device of at least one silicon-based photovoltaic solar cell, comprising:
   a heat source configured to heat the photovoltaic solar cell;
   a charge carriers generator configured to generate charge carries in the photovoltaic solar cell;
   an ultrasonic transducer designed to generate ultrasonic waves propagating in the photovoltaic solar cell;
   a first temperature regulator provided with elements configured to regulate the temperature of the photovoltaic solar cell to a target temperature value or range between 50° C.-230° C., wherein the elements for regulating the temperature of the photovoltaic solar cell comprise a tank designed to be filled by a liquid, and a support of the photovoltaic solar cell configured to place the photovoltaic solar cell in the liquid; and
   a support movement system configured to make the photovoltaic solar cell move in a direction parallel to the surface of the liquid in the tank.

2. The device according to claim 1, wherein the charge carriers generator comprises an electric current injecting system configured to inject an electric current into the photovoltaic solar cell.

3. The device according to claim 1 wherein the tank comprises a second regulator of the liquid temperature configured to regulate the temperature of the photovoltaic solar cell to the target temperature value or range.

4. The device according to claim 1 wherein the ultrasonic transducer is arranged in the tank and configured to generate a stationary regime of ultrasonic waves in the liquid and in the photovoltaic solar cell.

5. The device according to claim 1, wherein the ultrasonic transducer is placed between the photovoltaic solar cell and a support of the photovoltaic solar cell.

6. The device according to claim 1, wherein the ultrasonic transducer is shaped in such a way as to receive the photovoltaic solar cell.

7. The device according to claim 1, comprising a light source that is configured to form both the heat source and the charge carriers generator.

8. A restoration method of at least one silicon-based photovoltaic solar cell to counteract degradation of the efficiency under illumination, comprising the following steps:
   heating the photovoltaic solar cell;
   generating charge carriers in the photovoltaic solar cell; and
   generating a stationary regime of ultrasonic waves in the photovoltaic solar cell by using an ultrasonic transducer,
   wherein the ultrasonic transducer is placed between the photovoltaic solar cell and a support of the photovoltaic solar cell.

9. The restoration method according to claim 8, comprising a regulation step of the temperature of the photovoltaic solar cell to a target temperature value or range between 50° C.-230° C.

10. The restoration method according to claim 9, wherein the regulation step of the temperature of the photovoltaic solar cell is performed by immersing said cell in a liquid when the charge carrier generation step is performed.

11. The restoration method according to claim 10, wherein the liquid is a liquid having a boiling temperature strictly higher than 100° C.

12. The restoration method according to claim 11, wherein the liquid comprises ethylene glycol or glycerol or a soluble cutting oil.

13. A restoration device of at least one silicon-based photovoltaic solar cell, comprising:
 a heat source configured to heat the photovoltaic solar cell;
 a charge carriers generator configured to generate charge carries in the photovoltaic solar cell; and
 an ultrasonic transducer designed to generate ultrasonic waves propagating in the photovoltaic solar cell,
 wherein the ultrasonic transducer is placed between the photovoltaic solar cell and a support of the photovoltaic solar cell.

14. The device according to claim 13, wherein the charge carriers generator comprises an electric current injecting system configured to inject an electric current into the photovoltaic solar cell.

15. The device according to claim 14, comprising a first temperature regulator provided with elements configured to regulate the temperature of the photovoltaic solar cell to a target temperature value or range between 50° C.-230° C.

16. The device according to claim 15, wherein the elements for regulating the temperature of the photovoltaic solar cell comprise a tank designed to be filled by a liquid, and a support of the photovoltaic solar cell configured to place the photovoltaic solar cell in the liquid.

17. The device according to claim 16, wherein the tank comprises a second regulator of the liquid temperature configured to regulate the temperature of the photovoltaic solar cell to the target temperature value or range.

18. The device according to claim 16, wherein the ultrasonic transducer is arranged in the tank and configured to generate a stationary regime of ultrasonic waves in the liquid and in the photovoltaic solar cell.

19. The device according to claim 13, wherein the ultrasonic transducer is shaped in such a way as to receive the photovoltaic solar cell.

20. The device according to claim 13, comprising a light source that is configured to form both the heat source and the charge carriers generator.

21. A restoration device of at least one silicon-based photovoltaic solar cell, comprising:
 a heat source configured to heat the photovoltaic solar cell;
 a charge carriers generator configured to generate charge carries in the photovoltaic solar cell;
 an ultrasonic transducer designed to generate ultrasonic waves propagating in the photovoltaic solar cell,
 wherein the ultrasonic transducer is shaped in such a way as to receive the photovoltaic solar cell.

22. The device according to claim 21, wherein the charge carriers generator comprises an electric current injecting system configured to inject an electric current into the photovoltaic solar cell.

23. The device according to claim 21, comprising a first temperature regulator provided with elements configured to regulate the temperature of the photovoltaic solar cell to a target temperature value or range between 50° C.-230° C.

24. The device according to claim 23, wherein the elements for regulating the temperature of the photovoltaic solar cell comprise a tank designed to be filled by a liquid, and a support of the photovoltaic solar cell configured to place the photovoltaic solar cell in the liquid.

25. The device according to claim 24, wherein the tank comprises a second regulator of the liquid temperature configured to regulate the temperature of the photovoltaic solar cell to the target temperature value or range.

26. The device according to claim 24, wherein the ultrasonic transducer is arranged in the tank and configured to generate a stationary regime of ultrasonic waves in the liquid and in the photovoltaic solar cell.

27. The device according to claim 21, comprising a light source that is configured to form both the heat source and the charge carriers generator.

* * * * *